(12) United States Patent
Maenaka et al.

(10) Patent No.: US 10,477,671 B2
(45) Date of Patent: Nov. 12, 2019

(54) LAMINATED BODY

(71) Applicant: SEKISUI CHEMICAL CO., LTD., Osaka, Osaka (JP)

(72) Inventors: Hiroshi Maenaka, Osaka (JP); Osamu Inui, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 15/763,736

(22) PCT Filed: Sep. 29, 2016

(86) PCT No.: PCT/JP2016/078790
§ 371 (c)(1),
(2) Date: Mar. 27, 2018

(87) PCT Pub. No.: WO2017/057553
PCT Pub. Date: Apr. 6, 2017

(65) Prior Publication Data
US 2018/0302976 A1 Oct. 18, 2018

(30) Foreign Application Priority Data
Sep. 30, 2015 (JP) .................................. 2015-195409

(51) Int. Cl.
*H05K 1/02* (2006.01)
*B32B 15/08* (2006.01)
(Continued)

(52) U.S. Cl.
CPC ........... *H05K 1/0207* (2013.01); *B32B 15/08* (2013.01); *B32B 15/092* (2013.01); *B32B 15/20* (2013.01);
(Continued)

(58) Field of Classification Search
CPC ... H05K 1/0284; H05K 1/0207; H05K 1/0209
See application file for complete search history.

(56) References Cited

U.S. PATENT DOCUMENTS 6,828,510 B1 12/2004 Asai et al.
2002/0096759 A1 7/2002 Hirano et al.
(Continued)

FOREIGN PATENT DOCUMENTS

CN 203932097 U 11/2014
JP 2001-168529 A 6/2001
(Continued)

OTHER PUBLICATIONS

International Search Report for the Application No. PCT/JP2016/078790 dated Jan. 10, 2017.
(Continued)

*Primary Examiner* — Jeremy C Norris
(74) *Attorney, Agent, or Firm* — Cheng Law Group, PLLC

(57) ABSTRACT

There is provided a laminated body capable of lowering thermal resistance and capable of suppressing peeling off after a cooling/heating cycle. The laminated body according to the present invention includes an insulating resin layer, a first metal material being a metal foil or a metal plate, and a second metal material being a metal foil or a metal plate, the first metal material is layered on a first surface of the insulating resin layer and the second metal material is layered on a second surface opposite to the first surface of the insulating resin layer, the thickness of the insulating resin layer is 200 μm or less, the total thickness of the first metal material and the second metal material is 200 μm or more, the ratio of the thickness of the first metal material to the thickness of the second metal material is 0.2 or more and 5 or less, and the ratio of the surface area of a surface opposite to the insulating resin layer side of the first metal material to (Continued)

the surface area of a surface opposite to the insulating resin layer side of the second metal material is 0.5 or more and 2 or less.

14 Claims, 1 Drawing Sheet

(51) Int. Cl.
| | |
|---|---|
| *H05K 1/03* | (2006.01) |
| *B32B 15/092* | (2006.01) |
| *B32B 15/20* | (2006.01) |
| *B32B 27/20* | (2006.01) |
| *B32B 27/26* | (2006.01) |
| *B32B 27/28* | (2006.01) |
| *B32B 27/30* | (2006.01) |
| *B32B 27/34* | (2006.01) |
| *B32B 27/40* | (2006.01) |
| *B32B 27/42* | (2006.01) |

(52) U.S. Cl.
CPC ............. *B32B 27/20* (2013.01); *B32B 27/26* (2013.01); *B32B 27/281* (2013.01); *B32B 27/302* (2013.01); *B32B 27/34* (2013.01); *B32B 27/40* (2013.01); *B32B 27/42* (2013.01); *H05K 1/02* (2013.01); *H05K 1/0204* (2013.01); *H05K 1/0209* (2013.01); *H05K 1/0284* (2013.01); *H05K 1/0373* (2013.01); *B32B 2250/44* (2013.01); *B32B 2264/10* (2013.01); *B32B 2264/102* (2013.01); *B32B 2307/206* (2013.01); *B32B 2307/30* (2013.01); *B32B 2307/304* (2013.01); *B32B 2307/306* (2013.01); *B32B 2307/308* (2013.01); *B32B 2307/538* (2013.01); *B32B 2307/54* (2013.01); *B32B 2307/732* (2013.01); *B32B 2307/734* (2013.01); *B32B 2307/748* (2013.01); *B32B 2457/08* (2013.01); *H05K 2201/068* (2013.01); *H05K 2201/09745* (2013.01)

(56) References Cited

U.S. PATENT DOCUMENTS

| | | | |
|---|---|---|---|
| 2005/0039948 | A1 | 2/2005 | Asai et al. |
| 2008/0277148 | A1 | 11/2008 | Asai et al. |
| 2009/0255714 | A1 | 10/2009 | Sohn et al. |
| 2010/0122840 | A1 | 5/2010 | Asai et al. |
| 2011/0005812 | A1 | 1/2011 | Shimokawa et al. |
| 2011/0024164 | A1 | 2/2011 | Asai et al. |
| 2011/0036618 | A1 | 2/2011 | Lee et al. |
| 2011/0036626 | A1 | 2/2011 | Asai et al. |
| 2011/0192637 | A1 | 8/2011 | Asai et al. |
| 2011/0252641 | A1 | 10/2011 | Asai et al. |
| 2011/0253306 | A1 | 10/2011 | Asai et al. |
| 2012/0186867 | A1 | 7/2012 | Asai et al. |
| 2013/0040162 | A1 | 2/2013 | Fujisawa et al. |
| 2015/0351225 | A1* | 12/2015 | Nii .................. H05K 1/184 361/783 |

FOREIGN PATENT DOCUMENTS

| | | |
|---|---|---|
| JP | 2002-170911 A | 6/2002 |
| JP | 2004-63575 A | 2/2004 |
| JP | 2008-76263 A | 3/2006 |
| JP | 2007-27618 A | 2/2007 |
| JP | 2008-294251 A | 12/2008 |
| JP | 2009-101639 A | 5/2009 |
| JP | 2009-283528 A | 12/2009 |
| JP | 2011-505690 A | 2/2011 |
| JP | 2011-149067 A | 8/2011 |
| JP | 2011-243256 A | 12/2011 |
| JP | 2012-156449 A | 8/2012 |
| JP | 2012-175081 A | 9/2012 |
| JP | 2013-55156 A | 3/2013 |
| JP | 2014-118310 A | 6/2014 |
| WO | WO-2014/030313 A1 | 2/2014 |

OTHER PUBLICATIONS

Written Opinion of the International Searching Authority (PCT/ISA/237) for Application No. PCT/JP2016/078790 dated Jan. 10, 2017.
Notification of Reasons for Refusal for the Application No. 2016-560838 front Japan Patent Office dated Jul. 4, 2017.
Written Opinion of the International Searching Authority (PCT/ISA/237) for Application No. PCT/JP2016/078790 dated Jan. 10, 2017 (English Translation mailed Apr. 12, 2018).
The First Office Action for the Application No. 201680058141.6 from The State Intellectual Property Office of the People's Republic of China dated Nov. 9, 2018.
Database WPI Week 200256 Thomson Scientific London, GB; AN 2002-524213 XP002789692 and JP 2002-170911 A (Note: JP 2002-170911 A previously filed in USPTO on Mar. 27, 2018 and considered by Examiner on Sep. 29, 2018).
Database WPI Week 200722 Thomson Scientific London, GB; AN 2007-214182 XP002789694 and JP 2007-27618 A (Note: JP 2007-27618 A previously filed in USPTO on Mar. 27, 2018 and considered by Examiner on Sep. 29, 2018).
Supplementary European Search Report for Application No. EP 16 85 1724.1 dated Mar. 22, 2019.

* cited by examiner

[FIG. 1]
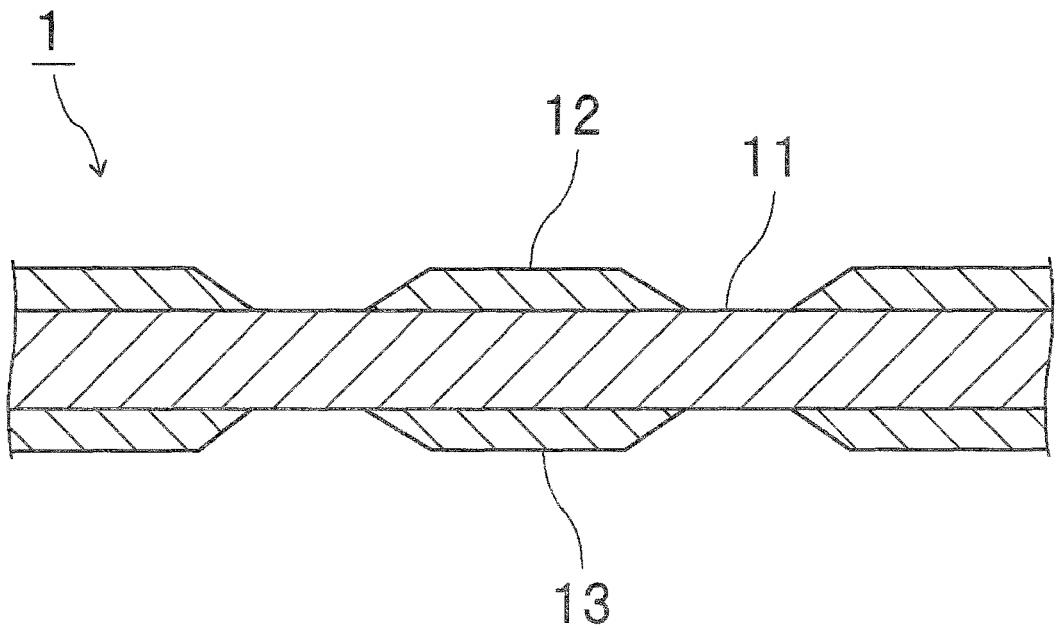
[FIG. 2]
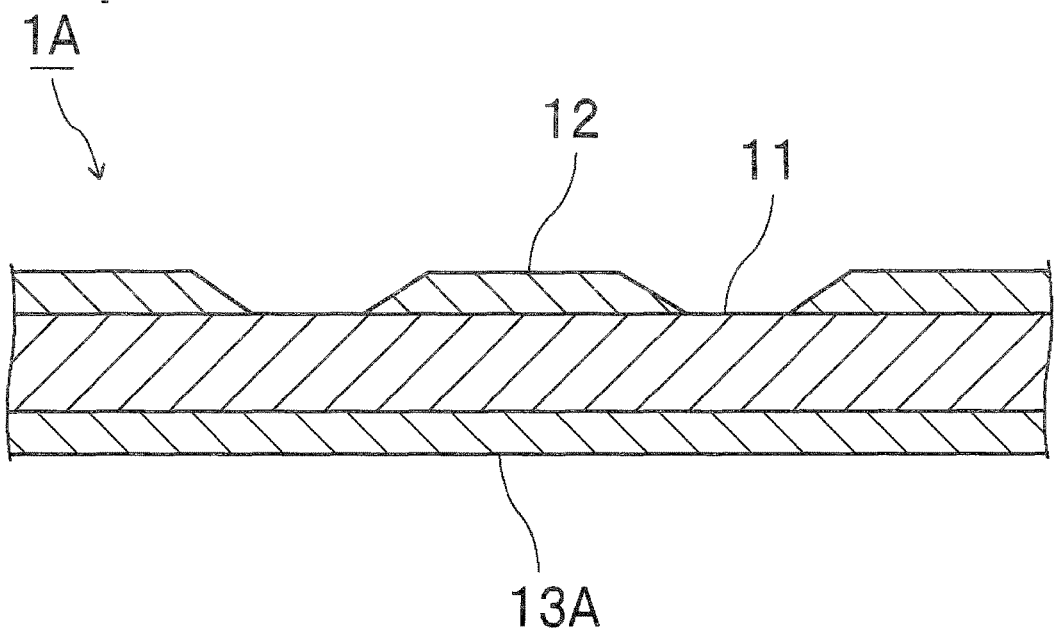

LAMINATED BODY

TECHNICAL FIELD

The present invention relates to a laminated body provided with an insulating resin layer, and a metal foil or a metal plate.

BACKGROUND ART

A laminated body in which a metal foil or a metal plate is layered on one side or both sides of an insulating resin layer has been known. For example, in exothermic devices such as a light-emitting diode (LED) device and a power semiconductor device, a module containing the exothermic device, and the like, such a laminated body has been used to suppress a temperature rise during use thereof.

The following Patent Document 1 discloses a laminated plate provided with an insulating resin layer, and a copper foil or a copper plate which is integrated with the insulating resin layer respectively on both sides thereof. The insulating resin layer has a thermal conductivity of 4 W/m·K or more. The total thickness of the a copper foil or copper plate which is integrated with the insulating resin layer respectively on both sides thereof is 600 μm or more.

Moreover, the following Patent Document 2 discloses a laminated body provided with a ceramic substrate and each metal plate which is bonded to the ceramic substrate respectively on both sides thereof through a silver/copper-based brazing material layer. In this laminated body, the ceramic substrate is arranged, instead of an insulating resin layer, between each of the two metal plates.

RELATED ART DOCUMENTS

Patent Documents

Patent Document 1: JP 2006-76263 A
Patent Document 2: JP 2014-118310 A

SUMMARY OF THE INVENTION

Problems to be Solved by the Invention

In a laminated body described in Patent Document 1, the thermal resistance sometimes fails to be lowered and the peeling off after a cooling/heating cycle sometimes fails to be suppressed. In all of the laminated bodies shown in examples and comparative examples of Patent Document 1, both of sufficiently low thermal resistance and sufficiently excellent peeling preventive properties after a cooling/heating cycle are not attained simultaneously.

Moreover, as described in Patent Document 2, when a ceramic substrate is used, there is a problem that peeling off is liable to occur after a cooling/heating cycle because the linear expansion coefficient of the ceramic substrate is considerably low.

An object of the present invention is to provide a laminated body capable of lowering the thermal resistance and capable of suppressing the peeling off after a cooling/heating cycle.

Means for Solving the Problems

In a broad aspect of the present invention, there is provided a laminated body including an insulating resin layer, a first metal material being a metal foil or a metal plate, and a second metal material being a metal foil or a metal plate, the first metal material being layered on a first surface of the insulating resin layer and the second metal material being layered on a second surface opposite to the first surface of the insulating resin layer, the thickness of the insulating resin layer being 200 μm or less, the total thickness of the first metal material and the second metal material being 200 μm or more, the ratio of the thickness of the first metal material to the thickness of the second metal material being 0.2 or more and 5 or less, and the ratio of the surface area of a surface opposite to the insulating resin layer side of the first metal material to the surface area of a surface opposite to the insulating resin layer side of the second metal material being 0.5 or more and 2 or less.

In a specific aspect of the laminated body according to the present invention, the ratio of the linear expansion coefficient of the insulating resin layer to the linear expansion coefficient of the first metal material is 0.5 or more and 2 or less and the ratio of the linear expansion coefficient of the insulating resin layer to the linear expansion coefficient of the second metal material is 0.5 or more and 2 or less.

In a specific aspect of the laminated body according to the present invention, the elastic modulus at 25° C. of the insulating resin layer is 1 GPa or more and 50 GPa or less.

In a specific aspect of the laminated body according to the present invention, a side face of the first metal material is inwardly inclined progressively toward a surface side opposite to the insulating resin layer side.

In a specific aspect of the laminated body according to the present invention, a side face of the second metal material is inwardly inclined progressively toward a surface side opposite to the insulating resin layer side.

In a specific aspect of the laminated body according to the present invention, the first metal material constitutes a circuit.

In a specific aspect of the laminated body according to the present invention, the insulating resin layer has a portion on which no first metal material is layered, the arithmetic average roughness Ra of a surface opposite to the insulating resin layer side of the first metal material is 2 μm or less, and the arithmetic average roughness Ra of a surface at the insulating resin layer side of the first metal material is 0.1 μm or more.

In a specific aspect of the laminated body according to the present invention, the ratio of the surface area of a surface opposite to the insulating resin layer side of the first metal material to the surface area of a surface at the insulating resin layer side of the first metal material is 0.8 or more and less than 1.0.

In a specific aspect of the laminated body according to the present invention, the first metal material constitutes a circuit and the second metal material constitutes a circuit.

In a specific aspect of the laminated body according to the present invention, the insulating resin layer has a portion on which no second metal material is layered, the arithmetic average roughness Ra of a surface opposite to the insulating resin layer side of the second metal material is 2 μm or less, and the arithmetic average roughness Ra of a surface at the insulating resin layer side of the second metal material is 0.1 μm or more.

In a specific aspect of the laminated body according to the present invention, the ratio of the surface area of a surface opposite to the insulating resin layer side of the second metal material to the surface area of a surface at the insulating resin layer side of the second metal material is 0.8 or less.

In a specific aspect of the laminated body according to the present invention, the glass transition temperature of the insulating resin layer is 150° C. or more.

In a specific aspect of the laminated body according to the present invention, the insulating resin layer is not constituted of a prepreg.

In a specific aspect of the laminated body according to the present invention, a surface at the opposite side of the insulating resin layer side of the first metal material is exposed or a protective film is layered on the surface at the opposite side of the insulating resin layer side of the first metal material.

In a specific aspect of the laminated body according to the present invention, a surface at the opposite side of the insulating resin layer side of the first metal material is exposed.

In a specific aspect of the laminated body according to the present invention, the insulating resin layer contains an inorganic filler.

Effect of the Invention

Since the laminated body according to the present invention includes an insulating resin layer, a first metal material being a metal foil or a metal plate, and a second metal material being a metal foil or a metal plate, the first metal material is layered on a first surface of the insulating resin layer and the second metal material is layered on a second surface opposite to the first surface of the insulating resin layer, the thickness of the insulating resin layer is 200 μm or less, the total thickness of the first metal material and the second metal material is 200 μm or more, the ratio of the thickness of the first metal material to the thickness of the second metal material is 0.2 or more and 5 or less, and the ratio of the surface area of a surface opposite to the insulating resin layer side of the first metal material to the surface area of a surface opposite to the insulating resin layer side of the second metal material is 0.5 or more and 2 or less, it is possible to lower the thermal resistance and it is possible to suppress the peeling off after a cooling/heating cycle.

BRIEF DESCRIPTION OF DRAWINGS

FIG. 1 is a sectional view showing a laminated body in accordance with a first embodiment of the present invention.

FIG. 2 is a sectional view showing a laminated body in accordance with a second embodiment of the present invention.

MODE(S) FOR CARRYING OUT THE INVENTION

Hereinafter, the present invention will be described in detail.

The laminated body according to the present invention is provided with an insulating resin layer, a first metal material, and a second metal material. The first metal material is a metal foil or a metal plate. The second metal material is a metal foil or a metal plate.

In the laminated body according to the present invention, the first metal material is layered on a first surface (one surface) of the insulating resin layer and the second metal material is layered on a second surface (the other surface) opposite to the first surface of the insulating resin layer.

In the laminated body according to the present invention, the thickness of the insulating resin layer is 200 μm or less. In the laminated body according to the present invention, the total thickness of the first metal material and the second metal material is 200 μm or more. In the laminated body according to the present invention, the ratio of the thickness of the first metal material to the thickness of the second metal material (thickness of first metal material/thickness of second metal material) is 0.2 or more and 5 or less. In the laminated body according to the present invention, the ratio of the surface area of a surface opposite to the insulating resin layer side of the first metal material to the surface area of a surface opposite to the insulating resin layer side of the second metal material (surface area of surface opposite to insulating resin layer side of first metal material/surface area of surface opposite to insulating resin layer side of second metal material) is 0.5 or more and 2 or less.

In the present invention, since the laminated body is provided with the above-mentioned configuration, it is possible to lower the thermal resistance and it is possible to suppress the peeling off after a cooling/heating cycle.

Hereinafter, specific embodiments of the present invention will be described with reference to the drawings.

FIG. 1 is a sectional view showing a laminated body in accordance with a first embodiment of the present invention.

A laminated body 1 shown in FIG. 1 is provided with an insulating resin layer 11, a first metal material 12, and a second metal material 13. The first metal material 12 is a metal foil or a metal plate. The second metal material 13 is a metal foil or a metal plate.

The first metal material 12 is layered on a first surface (one surface) of the insulating resin layer 11. The second metal material 13 is layered on a second surface (the other surface) of the insulating resin layer 11. In the present embodiment, the first metal material 12 and the second metal material 13 each constitute a circuit. The first metal material 12 and the second metal material 13 are formed in a partial region on the first surface of the insulating resin layer 11 and in a partial region on the second surface thereof, respectively. The first metal material and the second metal material may be formed in a partial region on at least one of the first surface and the second surface of the insulating resin layer.

In the present embodiment, side faces of the first metal material 12 are inwardly inclined progressively toward a surface side opposite to the insulating resin layer 11 side and side faces of the second metal material 13 are inwardly inclined progressively toward a surface side opposite to the insulating resin layer 11 side. In the laminated body 1, an insulating resin layer 11 portion on which no first metal material 12 is layered exists. In a laminated body, an insulating resin layer portion on which no first metal material is layered may exist. In the laminated body 1, an insulating resin layer 11 portion on which no second metal material 13 is layered exists. In a laminated body, an insulating resin layer portion on which no second metal material is layered may exist.

FIG. 2 is a sectional view showing a laminated body in accordance with a second embodiment of the present invention.

In the laminated body 1 shown in FIG. 1, the first metal material 12 and the second metal material 13 are formed in a partial region on the first surface of the insulating resin layer 11 and in a partial region on the second surface thereof, respectively. In a laminated body 1A shown in FIG. 2, the first metal material 12 is formed in a partial region on the first surface of the insulating resin layer 11 and constitutes a circuit. In the laminated body 1A, the second metal material 13A is formed over the whole region on the second surface of the insulating resin layer 11 and is a metal material not subjected to circuit formation processing. As described above, for example, the second metal material may be formed over the whole region on the second surface, may be a metal material not subjected to circuit formation processing, and may be a circuit formation scheduled metal material.

The thickness of the insulating resin layer 11 is 200 μm or less. The total thickness of the first metal material 12 and the second metal material 13 is 200 μm or more. The ratio (thickness of first metal material 12/thickness of second metal material 13) is 0.2 or more and 5 or less. The ratio (surface area of surface opposite to insulating resin layer 11 side of first metal material 12/surface area of surface opposite to insulating resin layer 11 side of second metal material 13) is 0.5 or more and 2 or less.

In the laminated body, it is preferred that the first metal material, the insulating resin layer, and the second metal material be integrated with one another.

The thickness of the insulating resin layer is 200 μm or less. From the viewpoints of effectively lowering the thermal resistance and effectively suppressing the peeling off after a cooling/heating cycle, the thickness of the insulating resin layer is preferably 150 μm or less and more preferably 100 μm or less. From the viewpoint of heightening the insulation reliability, the thickness of the insulating resin layer is preferably 40 or more and more preferably 60 μm or more. The thickness of the insulating resin layer is defined as an average value of thicknesses measured at plural locations of the insulating resin layer.

The total thickness of the first metal material and the second metal material is 200 μm or more. From the viewpoint of effectively heightening the heat-dissipating properties, the total thickness of the first metal material and the second metal material is preferably 400 μm or more. From the viewpoints of the lightweight properties and the handling properties, the total thickness of the first metal material and the second metal material is preferably 2 mm or less.

The ratio (thickness of first metal material/thickness of second metal material) is 0.2 or more and 5 or less. From the viewpoints of effectively lowering the thermal resistance and effectively suppressing the peeling off after a cooling/heating cycle, the ratio (thickness of first metal material/thickness of second metal material) is preferably 0.3 or more, more preferably 0.6 or more, further preferably 0.8 or more, preferably 3 or less, more preferably 1.6 or less, and further preferably 1.2 or less. The thickness of the first metal material is defined as an average value of thicknesses measured at plural locations of the first metal material. The thickness of the second metal material is defined as an average value of thicknesses measured at plural locations of the second metal material.

For example, a cross-section of a laminated body is observed by the use of a microscope ("VHX-5000" available from KEYENCE CORPORATION, and the like) and each of the insulating resin layer, the first metal material, and the second metal material can be measured for the thickness to be evaluated.

The ratio (surface area of surface opposite to insulating resin layer side of first metal material/surface area of surface opposite to insulating resin layer side of second metal material) is 0.5 or more and 2 or less. From the viewpoints of effectively lowering the thermal resistance and effectively suppressing the peeling off after a cooling/heating cycle, the ratio (surface area of surface opposite to insulating resin layer side of first metal material/surface area of surface opposite to insulating resin layer side of second metal material) is preferably 0.6 or more and preferably 1.67 or less.

For example, the surface can be observed by the use of the Image Dimension Measuring System ("IM-6125" available from KEYENCE CORPORATION) to be measured for the surface area.

From the viewpoint of effectively suppressing the peeling off after a cooling/heating cycle, the ratio of the linear expansion coefficient of the insulating resin layer to the linear expansion coefficient of the first metal material (linear expansion coefficient of insulating resin layer/linear expansion coefficient of first metal material) is preferably 0.5 or more, more preferably 0.6 or more, preferably 2 or less, and more preferably 1.8 or less.

From the viewpoint of effectively suppressing the peeling off after a cooling/heating cycle, the ratio of the linear expansion coefficient of the insulating resin layer to the linear expansion coefficient of the second metal material (linear expansion coefficient of insulating resin layer/linear expansion coefficient of second metal material) is preferably 0.5 or more, more preferably 0.6 or more, preferably 2 or less, and more preferably 1.8 or less.

From the viewpoint of effectively suppressing the peeling off after a cooling/heating cycle, the linear expansion coefficient of the insulating resin layer is preferably 5 ppm/° C. or more, more preferably 10 ppm/° C. or more, preferably 35 ppm/° C. or less, and more preferably 30 ppm/° C. or less.

The linear expansion coefficient is measured under the condition ranging from 25° C. to the glass transition temperature with the use of a thermomechanical analysis apparatus. Examples of the thermomechanical analysis apparatus include "TMA-60" available from SHIMADZU CORPORATION, and the like.

From the viewpoint of effectively suppressing the peeling off after a cooling/heating cycle, the elastic modulus at 25° C. of the insulating resin layer is preferably 1 GPa or more, more preferably 5 GPa or more, preferably 50 GPa or less, and more preferably 20 GPa or less.

The elastic modulus is measured under the condition of 25° C. with the use of a dynamic viscoelasticity measuring apparatus. Examples of the dynamic viscoelasticity measuring apparatus include "DMS6100" available from Hitachi High-Tech Science Corporation, and the like.

From the viewpoint of further suppressing the peeling off, it is preferred that a side face of the first metal material be inwardly inclined progressively toward a surface side opposite to the insulating resin layer side. From the viewpoint of further suppressing the peeling off, it is preferred that a side face of the second metal material be inwardly inclined progressively toward a surface side opposite to the insulating resin layer side.

For example, the etching amount at the time of subjecting a metal material to an etching treatment can be adjusted in order to make the first metal material have a side face inwardly inclined progressively toward a surface side opposite to the insulating resin layer side.

The first metal material may be layered over the whole first surface of the insulating resin layer and may be layered in a partial region on the first surface of the insulating resin layer. The second metal material may be layered over the whole second surface of the insulating resin layer and may be layered in a partial region on the second surface of the insulating resin layer.

From the viewpoint of further improving the heat-dissipating properties, the arithmetic average roughness Ra of a surface opposite to the insulating resin layer side of the first metal material is preferably 2 μm or less and more preferably 1 μm or less. The arithmetic average roughness Ra of a surface opposite to the insulating resin layer side of the first metal material may be 0 μm. From the viewpoint of further improving the heat-dissipating properties, the arithmetic average roughness Ra of a surface opposite to the insulating resin layer side of the second metal material is preferably 2 μm or less and more preferably 1 μm or less. The arithmetic average roughness Ra of a surface opposite to the insulating resin layer side of the second metal material may be 0 μm.

From the viewpoint of further enhancing the adhesive stability, the arithmetic average roughness Ra of a surface at the insulating resin layer side of the first metal material is preferably 0.1 μm or more and more preferably 0.2 μm or more. From the viewpoint of further enhancing the adhesive stability, the arithmetic average roughness Ra of a surface at the insulating resin layer side of the second metal material is preferably 0.1 μm or more and more preferably 0.2 μm or more.

The arithmetic average roughness Ra is measured in accordance with JIS B0601: 1994. Specifically, the arithmetic average roughness Ra is measured as below.

The arithmetic average roughness Ra is measured at a moving speed of 0.6 mm with the use of a surface texture measuring instrument ("SURFCOM FLEX" available from TOKYO SEIMITSU CO., LTD.).

The ratio of the surface area of a surface opposite to the insulating resin layer side of the first metal material to the surface area of a surface at the insulating resin layer side of the first metal material (surface area of surface opposite to insulating resin layer side of first metal material/surface area of surface at insulating resin layer side of first metal material) may be more than 1 and may be 1. From the viewpoints of further suppressing the peeling off and maintaining satisfactory heat-dissipating properties, the ratio (surface area of surface opposite to insulating resin layer side of first metal material/surface area of surface at insulating resin layer side of first metal material) is preferably 0.8 or more and preferably less than 1, The ratio of the surface area of a surface opposite to the insulating resin layer side of the second metal material to the surface area of a surface at the insulating resin layer side of the second metal material (surface area of surface opposite to insulating resin layer side of second metal material/surface area of surface at insulating resin layer side of second metal material) may be more than 1 and may be 1. From the viewpoints of further suppressing the peeling off and maintaining satisfactory heat-dissipating properties, the ratio (surface area of surface opposite to insulating resin layer side of second metal material/surface area of surface at insulating resin layer side of second metal material) is preferably 0.8 or more and preferably less than 1.

From the viewpoints of further enhancing the heat resistance and further suppressing the peeling off after a cooling/heating cycle, the glass transition temperature of the insulating resin layer is preferably 150° C. or more and more preferably 180° C. or more. It is preferable to make the glass transition temperature higher and the upper limit of the glass transition temperature is not particularly limited.

A cured product obtained is measured for the glass transition temperature at a temperature increasing rate of 5° C./minute with the use of a dynamic viscoelasticity measuring apparatus ("DMS6100" available from Hitachi High-Tech Science Corporation).

The insulating resin layer may be constituted of a prepreg and may not be constituted of a prepreg. From the viewpoint of further improving the heat-dissipating properties and insulating properties, it is preferred that the insulating resin layer be not constituted of a prepreg. In general, nonwoven fabric is impregnated with an insulating resin to prepare the prepreg. The nonwoven fabric may be glass cloth.

In the laminated body, it is preferred that a surface at the opposite side of the insulating resin layer side of the first metal material be exposed or a protective film be layered on the surface at the opposite side of the insulating resin layer side of the first metal material. The laminated body in which a surface at the opposite side of the insulating resin layer side of the first metal material is exposed or the laminated body in a state of having a surface, at the opposite side of the insulating resin layer side of the first metal material, on which a protective film is layered can be used. In this connection, such a laminated body is incorporated into an electronic component, after which another electronic component member may be layered on the surface at the opposite side of the insulating resin layer side of the first metal material. In the laminated body, it is preferred that a surface at the opposite side of the insulating resin layer side of the second metal material be exposed or a protective film be layered on the surface at the opposite side of the insulating resin layer side of the second metal material. The laminated body in which a surface at the opposite side of the insulating resin layer side of the second metal material is exposed or the laminated body in a state of having a surface, at the opposite side of the insulating resin layer side of the second metal material, on which a protective film is layered can be used. In this connection, such a laminated body is incorporated into an electronic component, after which another electronic component member may be layered on the surface at the opposite side of the insulating resin layer side of the second metal material.

Hereinafter, other details of the laminated body will be described.

(Insulating Resin Layer)

Examples of a material for the insulating resin layer include a curable compound (A) and a curing agent (B), and the like. For example, the insulating resin layer is a cured product of a curable composition (a material for the insulating resin layer) containing a curable compound and a thermosetting agent. Moreover, it is preferred that the material for the insulating resin layer contain an inorganic filler (C). It is preferred that the insulating resin layer contain an inorganic filler (C).

As the curable compound (A), a curable compound (A1) with a molecular weight of less than 10000 may be used, a curable compound (A2) with a molecular weight of 10000 or more may be used, and both of a curable compound (A1) with a molecular weight of less than 10000 and a curable compound (A2) with a molecular weight of 10000 or more may be used. One kind of the curable compound (A) may be used alone and two or more kinds thereof may be used in combination.

Curable Compound (A1):

Examples of the curable compound (A1) with a molecular weight of less than 10000 include a curable compound having a cyclic ether group. Examples of the cyclic ether group include an epoxy group, an oxetanyl group, and the like. It is preferred that the curable compound having the cyclic ether group be a curable compound having an epoxy group or an oxetanyl group. One kind of the curable compound (A1) may be used alone and two or more kinds thereof may be used in combination.

The curable compound (A1) may include an epoxy compound (A1a) having an epoxy group and may include an oxetane compound (A1b) having an oxetanyl group.

From the viewpoint of further enhancing the heat resistance and voltage endurance of a cured product, it is preferred that the curable compound (A1) have an aromatic skeleton.

The aromatic skeleton is not particularly limited and examples thereof include a naphthalene skeleton, a fluorene skeleton, a biphenyl skeleton, an anthracene skeleton, a pyrene skeleton, a xanthene skeleton, an adamantane skeleton, a bisphenol A type skeleton, and the like. A biphenyl skeleton or a fluorene skeleton is preferred. In this case, the cooling/heating cycle resistance and heat resistance of a cured product are further enhanced.

Specific examples of the epoxy compound (A1a) having an epoxy group include an epoxy monomer having a bisphenol skeleton, an epoxy monomer having a dicyclopentadiene skeleton, an epoxy monomer having a naphthalene skeleton, an epoxy monomer having an adamantane skeleton, an epoxy monomer having a fluorene skeleton, an epoxy monomer having a biphenyl skeleton, an epoxy monomer having a bi(glycidyloxyphenyl)methane skeleton, an epoxy monomer having a xanthene skeleton, an epoxy monomer having an anthracene skeleton, an epoxy monomer having a pyrene skeleton, and the like. A hydrogenated product thereof or a modified product thereof may be used. One kind of the epoxy compound (A1a) may be used alone and two or more kinds thereof may be used in combination.

Examples of the epoxy monomer having a bisphenol skeleton include an epoxy monomer having a bisphenol skeleton of a bisphenol A type, a bisphenol F type, or a bisphenol S type, and the like.

Examples of the epoxy monomer having a dicyclopentadiene skeleton include dicyclopentadiene dioxide, a phenol novolac epoxy monomer having a dicyclopentadiene skeleton, and the like.

Examples of the epoxy monomer having a naphthalene skeleton include 1-glycidylnaphthalene, 2-glycidylnaphthalene, 1,2-diglycidylnaphthalene, 1,5-diglycidylnaphthalene, 1,6-diglycidylnaphthalene, 1,7-diglycidylnaphthalene, 2,7-diglycidylnaphthalene, triglycidylnaphthalene, 1,2,5,6-tetraglycidylnaphthalene, and the like.

Examples of the epoxy monomer having an adamantane skeleton include 1,3-bis(4-glycidyloxyphenyl)adamantane, 2,2-bis(4-glycidyloxyphenyl)adamantane, and the like.

Examples of the epoxy monomer having a fluorene skeleton include 9,9-bis(4-glycidyloxyphenyl)fluorene, 9,9-bis(4-glycidyloxy-3-methylphenyl)fluorene, 9,9-bis(4-glycidyloxy-3-chlorophenyl)fluorene, 9,9-bis(4-glycidyloxy-3-bromophenyl)fluorene, 9,9-bis(4-glycidyloxy-3-fluorophenyl)fluorene, 9,9-bis(4-glycidyloxy-3-methoxyphenyl)fluorene, 9,9-bis(4-glycidyloxy-3,5-dimethylphenyl)fluorene, 9,9-bis(4-glycidyloxy-3,5-dichlorophenyl)fluorene, 9,9-bis(4-glycidyloxy-3,5-dibromophenyl)fluorene, and the like.

Examples of the epoxy monomer having a biphenyl skeleton include 4,4'-diglycidylbiphenyl, 4,4'-diglycidyl-3,3',5,5'-tetramethylbiphenyl, and the like.

Examples of the epoxy monomer having a bi(glycidyloxyphenyl)methane skeleton include 1,1'-bi(2,7-glycidyloxynaphthyl)methane, 1,8'-bi(2,7-glycidyloxynaphthyl)methane, 1,1'-bi(3,7-glycidyloxynaphthyl)methane, 1,8'-bi(3,7-glycidyloxynaphthyl)methane, 1,1'-bi(3,5-glycidyloxynaphthyl)methane, 1,8'-bi(3,5-glycidyloxynaphthyl)methane, 1,2'-bi(2,7-glycidyloxynaphthyl)methane, 1,2'-bi(3,7-glycidyloxynaphthyl)methane, 1,2'-bi(3,5-glycidyloxynaphthyl)methane, and the like.

Examples of the epoxy monomer having a xanthene skeleton include 1,3,4,5,6,8-hexamethyl-2,7-bis-oxiranylmethoxy-9-phenyl-9H-xanthene, and the like.

Specific examples of the oxetane compound (A1b) having an oxetanyl group include 4,4'-bis[(3-ethyl-3-oxetanyl)methoxymethyl]biphenyl, 1,4-benzenedicarboxylic acid bis[(3-ethyl-3-oxetanyl)methyl]ester, 1,4-bis[(3-ethyl-3-oxetanyl)methoxymethyl]benzene, an oxetane-modified phenol novolac, and the like. One kind of the oxetane compound (A1b) may be used alone and two or more kinds thereof may be used in combination.

From the viewpoint of further improving the heat resistance of a cured product, it is preferred that the curable compound (A1) have two or more cyclic ether groups.

From the viewpoint of further improving the heat resistance of a cured product, in 100% by weight of the curable compound (A1), the content of a curable compound having two or more cyclic ether groups is preferably 70% by weight or more, more preferably 80% by weight or more, and 100% by weight or less. In 100% by weight of the curable compound (A1), the content of a curable compound having two or more cyclic ether groups may be 10% by weight or more and 100% by weight or less. Moreover, the whole curable compound (A1) may be constituted of a curable compound having two or more cyclic ether groups.

The molecular weight of the curable compound (A1) is less than 10000. The molecular weight of the curable compound (A1) is preferably 200 or more, more preferably 1200 or less, further preferably 600 or less, and especially preferably 550 or less. When the molecular weight of the curable compound (A1) is the above lower limit or more, the stickiness of the surface of a cured product is lowered and the handling properties of a curable composition are further enhanced. When the molecular weight of the curable compound (A1) is the above upper limit or less, the adhesiveness of a cured product is further heightened. Furthermore, a cured product is less liable to become hard and brittle and the adhesiveness of the cured product is further heightened.

In this connection, in the present specification, the molecular weight of a curable compound (A1) means a molecular weight that can be calculated from its structural formula when the curable compound is not a polymer and when the structural formula thereof can be specified, and means a weight average molecular weight when the curable compound is a polymer.

In 100% by weight of materials excluding a solvent and an inorganic filler from materials for the insulating resin layer (in 100% by weight of materials excluding an inorganic filler therefrom when materials for the insulating resin layer include no solvent and include an inorganic filler, in 100% by weight of materials excluding a solvent therefrom when materials for the insulating resin layer include a solvent and include no inorganic filler, or in 100% by weight of materials for the insulating resin layer when materials for the insulating resin layer include no solvent and include no inorganic filler), the content of the curable compound (A1) is preferably 10% by weight or more, more preferably 20% by weight or more, preferably 90% by weight or less, more preferably 80% by weight or less, further preferably 70% by weight or less, especially preferably 60% by weight or less, and most preferably 50% by weight or less. When the content of the curable compound (A1) is the above lower limit or more, the adhesiveness and heat resistance of a cured product are further heightened. When the content of the curable compound (A1) is the above upper limit or less, the coating properties at the time of preparing an insulating resin layer are enhanced.

Curable Compound (A2):

The curable compound (A2) is a curable compound with a molecular weight of 10000 or more. The curable compound (A2) with a molecular weight of 10000 or more is generally a polymer and the molecular weight generally means a weight average molecular weight.

It is preferred that the curable compound (A2) have an aromatic skeleton. In this case, the heat resistance of a cured product is enhanced and the moisture resistance of the cured product is also enhanced. When a curable compound (A2) has an aromatic skeleton, the curable compound (A2) needs only to have an aromatic skeleton at any portion of the whole polymer, may have an aromatic skeleton within its main chain skeleton, and may have an aromatic skeleton in its side chain. From the viewpoints of further enhancing the heat resistance of a cured product and further enhancing the moisture resistance of the cured product, it is preferred that the curable compound (A2) have an aromatic skeleton within its main chain skeleton. One kind of the curable compound (A2) may be used alone and two or more kinds thereof may be used in combination.

The aromatic skeleton is not particularly limited and examples thereof include a naphthalene skeleton, a fluorene skeleton, a biphenyl skeleton, an anthracene skeleton, a pyrene skeleton, a xanthene skeleton, an adamantane skeleton, a bisphenol A type skeleton, and the like. A biphenyl skeleton or a fluorene skeleton is preferred. In this case, the cooling/heating cycle resistance and heat resistance of a cured product are further enhanced.

As the curable compound (A2), a curable resin such as a thermoplastic resin and a thermosetting resin, and the like are usable. It is preferred that the curable compound (A2) be a thermoplastic resin or a thermosetting resin. It is preferred that the curable compound (A2) be a curable resin. It is preferred that the curable compound (A2) be a thermoplastic resin and it is also preferred that the curable compound (A2) be a thermosetting resin.

The thermoplastic resin and the thermosetting resin are not particularly limited. The thermoplastic resin is not particularly limited and examples thereof include a styrene resin, a phenoxy resin, a phthalate resin, a thermoplastic urethane resin, a polyamide resin, a thermoplastic polyimide resin, a ketone resin, a norbornene resin, and the like. The thermosetting resin is not particularly limited and examples thereof include an amino resin, a phenol resin, a thermosetting urethane resin, an epoxy resin, a thermosetting polyimide resin, an amino-alkyd resin, and the like. Examples of the amino resin include a urea resin, a melamine resin, and the like.

From the viewpoints of suppressing the oxidative degradation of a cured product, further enhancing the cooling/heating cycle resistance and heat resistance of the cured product, and further lowering the water absorption ratio of the cured product, it is preferred that the curable compound (A2) be a styrene resin, a phenoxy resin, or an epoxy resin, it is more preferred that the curable compound (A2) be a phenoxy resin or an epoxy resin, and it is further preferred that the curable compound (A2) be a phenoxy resin. In particular, by the use of a phenoxy resin or an epoxy resin, the heat resistance of a cured product is further enhanced. Moreover, by the use of a phenoxy resin, the elastic modulus of a cured product is further lowered and the cooling/heating cycle resistance of the cured product is further enhanced. In this connection, the curable compound (A2) may not have a cyclic ether group such as an epoxy group.

As the styrene resin, specifically, a single polymer of a styrenic monomer, a copolymer of a styrenic monomer and an acrylic monomer, and the like are usable. A styrenic polymer having a styrene-glycidyl methacrylate structural unit is preferred.

Examples of the styrenic monomer include styrene, o-methylstyrene, m-methylstyrene, p-methylstyrene, p-methoxystyrene, p-phenylstyrene, p-chlorostyrene, p-ethylstyrene, p-n-butylstyrene, p-tert-butylstyrene, p-n-hexylstyrene, p-n-octylstyrene, p-n-nonylstyrene, p-n-decylstyrene, p-n-dodecylstyrene, 2,4-dimethylstyrene, 3,4-dichlorostyrene, and the like.

Specifically, examples of the phenoxy resin include a resin obtained by making an epihalohydrin and a divalent phenol compound react with each other and a resin obtained by making a divalent epoxy compound and a divalent phenol compound react with each other.

It is preferred that the phenoxy resin have a bisphenol A type skeleton, a bisphenol F type skeleton, a bisphenol A/F mixed type skeleton, a naphthalene skeleton, a fluorene skeleton, a biphenyl skeleton, an anthracene skeleton, a pyrene skeleton, a xanthene skeleton, an adamantane skeleton, or a dicyclopentadiene skeleton. It is more preferred that the phenoxy resin have a bisphenol A type skeleton, a bisphenol F type skeleton, a bisphenol A/F mixed type skeleton, a naphthalene skeleton, a fluorene skeleton, or a biphenyl skeleton and it is further preferred that the phenoxy resin have at least one kind of skeleton among a fluorene skeleton and a biphenyl skeleton. By the use of a phenoxy resin having these preferred skeletons, the heat resistance of a cured product is still further enhanced.

The epoxy resin is an epoxy resin excluding the phenoxy resin. Examples of the epoxy resin include a styrene skeleton-containing epoxy resin, a bisphenol A type epoxy resin, a bisphenol F type epoxy resin, a bisphenol S type epoxy resin, a phenol novolac type epoxy resin, a biphenol type epoxy resin, a naphthalene type epoxy resin, a fluorene type epoxy resin, a phenol aralkyl type epoxy resin, a naphthol aralkyl type epoxy resin, a dicyclopentadiene type epoxy resin, an anthracene type epoxy resin, an epoxy resin having an adamantane skeleton, an epoxy resin having a tricyclodecane skeleton, an epoxy resin having a triazine nucleus in its skeleton, and the like.

The molecular weight of the curable compound (A2) is 10000 or more. The molecular weight of the curable compound (A2) is preferably 30000 or more, more preferably 40000 or more, preferably 1000000 or less, and more preferably 250000 or less. When the molecular weight of the curable compound (A2) is the above lower limit or more, a cured product is less liable to be thermally deteriorated. When the molecular weight of the curable compound (A2) is the above upper limit or less, the compatibility between the curable compound (A2) and another ingredient is heightened. As a result, the heat resistance of a cured product is further enhanced.

In 100% by weight of materials excluding a solvent and an inorganic filler from materials for the insulating resin layer, the content of the curable compound (A2) is preferably 20% by weight or more, more preferably 30% by weight or more, preferably 60% by weight or less, and further preferably 50% by weight or less. When the content of the curable compound (A2) is the above lower limit or more, the handling properties of a curable composition are improved. When the content of the curable compound (A2) is the above upper limit or less, an inorganic filler (C) is easily dispersed.

Curing Agent (B):

It is preferred that the material for the insulating resin layer contain a curing agent (B). One kind of the curing agent (B) may be used alone and two or more kinds thereof may be used in combination.

From the viewpoint of further enhancing the heat resistance of a cured product, it is preferred that the curing agent (B) have an aromatic skeleton or an alicyclic skeleton. It is preferred that the curing agent (B) include an amine curing agent (amine compound), an imidazole curing agent, a phenol curing agent (phenol compound), or an acid anhydride curing agent (acid anhydride) and it is more preferred that the curing agent (B) include an amine curing agent. It is preferred that the acid anhydride curing agent contain an acid anhydride having an aromatic skeleton, a hydrogenated product of the acid anhydride, or a modified product of the acid anhydride or contain an acid anhydride having an alicyclic skeleton, a hydrogenated product of the acid anhydride, or a modified product of the acid anhydride.

It is preferred that the curing agent (B) include a basic curing agent, contain a phenol resin having a melamine skeleton or a triazine skeleton, or contain a phenol resin having an allyl group. Furthermore, from the viewpoints of improving the dispersibility of an inorganic filler (C) and, in addition, further heightening the voltage endurance and thermal conductivity of a cured product, it is preferred that the curing agent (B) include a basic curing agent. Moreover, from the viewpoints of further improving the dispersibility of an inorganic filler (C) and, in addition, further heightening the voltage endurance and thermal conductivity of a cured product, it is more preferred that the curing agent (B) include an amine curing agent and it is especially preferred that the curing agent (B) contain dicyandiamide. The imidazole curing agent is also a kind of amine curing agent. Moreover, it is also preferred that the curing agent (B) include both of dicyandiamide and an imidazole curing agent. By the use of these preferred curing agents, the dispersibility of an inorganic filler (C) in a curable composition is enhanced, and furthermore, a cured product excellent in balance among heat resistance, moisture resistance, and electrical properties is attained. As a result, even when the content of an inorganic filler (C) is reduced, the thermal conductivity is considerably enhanced. In particular, when dicyandiamide is used, the adhesiveness between a cured product and a metal material is considerably heightened.

In this connection, whether or not a curing agent (B) is a basic curing agent is judged by whether or not an extraction liquid obtained when 1 g of a curing agent is added to 10 g of a liquid mixture of 5 g of acetone and 5 g of pure water and heated with stirring for 1 hour at 80° C., and then, the liquid after heating is filtered to remove an insoluble component has a basic pH.

Examples of the amine curing agent include dicyandiamide, an imidazole compound, diaminodiphenylmethane, diaminodiphenylsulfone, and the like. From the viewpoint of further heightening the adhesiveness between a cured product and a metal material, it is further preferred that the amine curing agent be dicyandiamide or an imidazole curing agent. From the viewpoint of further enhancing the storage stability of a curable composition, it is preferred that the curing agent (B) be constituted of a curing agent having a melting point of 180° C. or more and it is more preferred that the curing agent (B) be constituted of an amine curing agent having a melting point of 180° C. or more.

Examples of the imidazole curing agent include 2-undecylimidazole, 2-heptadecylimidazole, 2-methylimidazole, 2-ethyl-4-methylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole, 2-phenyl-4-methyl-5-dihydroxymethylimidazole, and the like.

Examples of the phenol curing agent include a phenol novolac, o-cresol novolac, p-cresol novolac, t-butylphenol novolac, dicyclopentadiene cresol, poly-para-vinylphenol, bisphenol A type novolac, a xylylene-modified novolac, a decalin-modified novolac, poly(di-o-hydroxyphenyl)methane, poly(di-m-hydroxyphenyl)methane, poly(di-p-hydroxyphenyl)methane, and the like. From the viewpoint of further enhancing the flexibility of a cured product and the flame retardancy of the cured product, a phenol resin having a melamine skeleton, a phenol resin having a triazine skeleton, or a phenol resin having an allyl group is preferred.

Examples of a commercial product of the phenol curing agent include MEH-8005, MEH-8010, and MEH-8015 (any of these above is available from Meiwa Plastic Industries, Ltd.), YLH903 (available from Mitsubishi Chemical Corporation), LA-7052, LA-7054, LA-7751, LA-1356, and LA-3018-50P (any of these above is available from DIC Corporation), PS6313 and PS6492 (any of these above is available from Gun Ei Chemical Industry Co., Ltd.), and the like.

Examples of the acid anhydride having an aromatic skeleton, the hydrogenated product of the acid anhydride, or the modified product of the acid anhydride include a styrene/maleic anhydride copolymer, benzophenonetetracarboxylic anhydride, pyromellitic anhydride, trimellitic anhydride, 4,4'-oxydiphthalic anhydride, phenylethynylphthalic anhydride, glycerol bis(anhydrotrimellitate)monoacetate, ethylene glycol bis(anhydrotrimellitate), methyl tetrahydrophthalic anhydride, methyl hexahydrophthalic anhydride, a trialkyl tetrahydrophthalic anhydride, and the like.

Examples of a commercial product of the acid anhydride having an aromatic skeleton, the hydrogenated product of the acid anhydride, or the modified product of the acid anhydride include SMA Resin EF30, SMA Resin EF40, SMA Resin EF60, and SMA Resin EF80 (any of these above is available from SARTOMER JAPAN INC.), ODPA-M and PEPA (any of these above is available from Manac Incorporated), RIKACID MTA-10, RIKACID MTA-15, RIKACID TMTA, RIKACID TMEG-100, RIKACID TMEG-200, RIKACID TMEG-300, RIKACID TMEG-500, RIKACID TMEG-S, RIKACID TH, RIKACID HT-1A, RIKACID HH, RIKACID MH-700, RIKACID MT-500, RIKACID DSDA, and RIKACID TDA-100 (any of these above is available from New Japan Chemical Co., Ltd.), EPICLON B4400, EPICLON B650, and EPICLON B570 (any of these above is available from DIC Corporation), and the like.

It is preferred that the acid anhydride having an alicyclic skeleton, the hydrogenated product of the acid anhydride, or the modified product of the acid anhydride be an acid anhydride having a polyalicyclic skeleton, a hydrogenated product of the acid anhydride, or a modified product of the acid anhydride, or an acid anhydride having an alicyclic skeleton obtained by an addition reaction of a terpene-based compound with maleic anhydride, a hydrogenated product of the acid anhydride, or a modified product of the acid anhydride. By the use of these curing agents, the flexibility of a cured product and the moisture resistance and adhesiveness of the cured product are further enhanced.

Examples of the acid anhydride having an alicyclic skeleton, the hydrogenated product of the acid anhydride, or the modified product of the acid anhydride also include methylnadic anhydride, an acid anhydride having a dicyclopentadiene skeleton or a modified product of the acid anhydride, and the like.

Examples of a commercial product of the acid anhydride having an alicyclic skeleton, the hydrogenated product of the acid anhydride, or the modified product of the acid anhydride include RIKACID HNA and RIKACID HNA-100 (any of these above is available from New Japan Chemical Co., Ltd.), Epicure YH306, Epicure YH307, Epicure YH308, and Epicure YH309 (any of these above is available from Mitsubishi Chemical Corporation), and the like.

It is also preferred that the curing agent (B) be methylnadic anhydride or a trialkyl tetrahydrophthalic anhydride. By the use of methylnadic anhydride or a trialkyl tetrahydrophthalic anhydride, the water resistance of a cured product is enhanced.

In 100% by weight of materials excluding a solvent and an inorganic filler from materials for the insulating resin layer, the content of the curing agent (B) is preferably 0.1% by weight or more, more preferably 1% by weight or more, preferably 40% by weight or less, and more preferably 25% by weight or less. When the content of the curing agent (B) is the above lower limit or more, a curable composition is easy to be sufficiently cured. When the content of the curing agent (B) is the above upper limit or less, an excess of the curing agent (B) not taking part in the curing is less liable to be generated. As such, the heat resistance and adhesiveness of a cured product are further enhanced.

(Inorganic Filler (C))

By the use of an inorganic filler (C), the thermal conductivity of a cured product is considerably enhanced. One kind of the inorganic filler (C) may be used alone and two or more kinds thereof may be used in combination.

From the viewpoint of further enhancing the thermal conductivity of a cured product, the thermal conductivity of the inorganic filler (C) is preferably 10 W/m·K or more, more preferably 15 W/m·K or more, and further preferably 20 W/m·K or more. The upper limit of the thermal conductivity of the inorganic filler (C) is not particularly limited. An inorganic filler with a thermal conductivity of 300 W/m·K or so has been widely known, and moreover, an inorganic filler with a thermal conductivity of 200 W/m·K or so is easily available.

It is preferred that the inorganic filler (C) be made of alumina, synthetic magnesite, boron nitride, aluminum nitride, silicon nitride, silicon carbide, zinc oxide, or magnesium oxide and it is more preferred that the inorganic filler (C) be made of alumina, boron nitride, aluminum nitride, silicon nitride, silicon carbide, zinc oxide, or magnesium oxide. By the use of these kinds of preferred inorganic filler, the thermal conductivity of a cured product is further enhanced.

It is more preferred that the inorganic filler (C) excluding silica be spherical alumina, crushed alumina, or spherical aluminum nitride and it is further preferred that the filler be spherical alumina or spherical aluminum nitride. By the use of these kinds of preferred inorganic filler, the thermal conductivity of a cured product is further enhanced.

The new Mohs hardness of the inorganic filler (C) is preferably 12 or less and more preferably 9 or less. When the new Mohs hardness of the inorganic filler (C) is 9 or less, the processability of a cured product is further enhanced.

From the viewpoint of further enhancing the processability of a cured product, it is preferred that the inorganic filler (C) be made of synthetic magnesite, crystalline silica, zinc oxide, or magnesium oxide. These kinds of inorganic filler have a new Mohs hardness of 9 or less.

The inorganic filler (C) may be constituted of a filler having a spherical shape (spherical filler), may be constituted of particles of filler which have been crushed into broken pieces (crushed filler), and may be constituted of a filler having a plate-like shape (platy filler). It is especially preferred that the inorganic filler (C) be constituted of a spherical filler. By the use of a spherical filler, the thermal conductivity of a cured product is further enhanced because the cured product can be filled highly densely with the spherical filler.

Examples of the crushed filler include crushed alumina, crushed silica, and the like. For example, using a uniaxial crusher, a biaxial crusher, a hammer crusher, a ball mill, or the like, a lump-like inorganic material is crushed into broken pieces to obtain the crushed filler. By the use of a crushed filler, particles of the filler in a cured product are easily made to have a bridged structure or a structure in which particles thereof are effectively closely arranged. Accordingly, the thermal conductivity of the cured product is further enhanced. Moreover, a crushed filler is generally inexpensive as compared with a normal filler. As such, by the use of a crushed filler, the curable composition requires low production costs.

It is preferred that the silica be constituted of particles of silica which have been crushed into broken pieces (crushed silica). By the use of the crushed silica, the moisture resistance of a cured product is further enhanced, and when a cured product is subjected to a pressure cooker test, the voltage endurance becomes further difficult to be lowered.

The average particle diameter of the crushed filler is preferably 12 µm or less, more preferably 10 µm or less, and preferably 1 µm or more. When the average particle diameter of a crushed filler is the above upper limit or less, particles of the crushed filler can be dispersed highly densely in a curable composition and the voltage endurance of a cured product is further heightened. When the average particle diameter of a crushed filler is the above lower limit or more, it becomes easy to fill an insulating resin layer highly densely with the crushed filler.

The aspect ratio of the crushed filler is not particularly limited. The aspect ratio of the crushed filler is preferably 1.5 or more and preferably 20 or less. A filler with an aspect ratio of less than 1.5 is relatively expensive and the curable composition requires high production costs. When the aspect ratio is 20 or less, a cured product can be easily filled with the crushed filler.

For example, with the use of a digital image analysis type particle size distribution measuring apparatus ("FPA" available from Nihon Rufuto Co., Ltd.), a fracture surface of a filler can be measured to determine the aspect ratio of the crushed filler.

The average particle diameter of the inorganic filler (C) is preferably 0.1 µm or more and preferably 40 µm or less. When the average particle diameter is the above lower limit or more, a cured product can be easily filled highly densely with the inorganic filler (C). When the average particle diameter is the above upper limit or less, the voltage endurance of a cured product is further heightened.

The above-mentioned "average particle diameter" refers to an average particle diameter determined from the result of the volume average particle size distribution measurement performed using a laser diffraction type particle size distribution measuring apparatus.

In 100% by weight of materials excluding a solvent from materials for the insulating resin layer (in 100% by weight of materials for the insulating resin layer when materials for the insulating resin layer include no solvent or in 100% by weight of materials excluding a solvent therefrom when materials for the insulating resin layer include a solvent) or in 100% by weight of an insulating resin layer, the content of the inorganic filler (C) is preferably 50% by weight or more, more preferably 70% by weight or more, preferably 97% by weight or less, and more preferably 95% by weight or less. When the content of the inorganic filler (C) is the above lower limit or more and the above upper limit or less, the thermal conductivity of a cured product is effectively enhanced.

Other Ingredients:

Other than the above-described ingredients, examples of the material for the insulating resin layer may include additional ingredients, which are generally used for an insulating resin layer, such as a dispersant, a chelating agent, and an oxidation inhibitor.

(First Metal Material and Second Metal Material (Metal Material))

Examples of the material for the metal material include aluminum, copper, gold, a graphite sheet, and the like. From the viewpoint of further improving the thermal conductivity, it is preferred that the material for the metal material be gold, copper, or aluminum and it is more preferred that the material therefor be copper or aluminum. From the viewpoint of further improving the thermal conductivity and the viewpoint of easily forming an etching-treated metal material, it is more preferred that the metal material be made of copper. Moreover, it is preferred that the metal material be a metal foil.

Hereinafter, the present invention will be elucidated with reference to specific examples of the present invention and comparative examples. In this connection, the present invention is not limited to the following examples.

The following materials were prepared.
Curable Compound (A1)
(1) A bisphenol A type liquid epoxy resin ("Epikote 828US" available from Mitsubishi Chemical Corporation, Mw=370)
(2) A bisphenol F type liquid epoxy resin ("Epikote 806L" available from Mitsubishi Chemical Corporation, Mw=370)
(3) A naphthalene type liquid epoxy resin ("EPICLON HP-4032D" available from DIC Corporation, Mw=304)
Curable Compound (A2)
(1) An epoxy group-containing styrene resin ("MARPROOF G-1010S" available from NOF CORPORATION, Mw=100,000, Tg=93° C.)
(2) A bisphenol A type phenoxy resin ("E1256" available from Mitsubishi Chemical Corporation, Mw=51,000, Tg=98° C.)
Curing Agent (B)
(1) An acid anhydride with an alicyclic skeleton ("MH-700" available from New Japan Chemical Co., Ltd.)
(2) A phenol resin with a biphenyl skeleton ("MEH-7851-S" available from Meiwa Plastic Industries, Ltd.)

(3) An isocyanurate-modified solid-dispersed imidazole (imidazole-based curing accelerator, "2MZA-PW" available from SHIKOKU CHEMICALS CORPORATION)
Inorganic Filler (C)
(1) 5-μm Alumina (crushed alumina, "LT300C" available from Nippon Light Metal Company, Ltd., average particle diameter of 5 μm)
(2) Boron nitride ("MBN-010T" available from Mitsui Chemicals, Inc., average particle diameter of 0.9 μm)
(3) Aluminum nitride ("MAN-2A" available from Mitsui Chemicals, Inc., average particle diameter of 1.3 μm)
Additive
(1) An epoxysilane coupling agent ("KBE403" available from Shin-Etsu Chemical Co., Ltd.)
Solvent
(1) Methyl Ethyl Ketone Examples 1 to 16 and Comparative Examples 1 to 6

With the use of a homogenizing disperser-type stirrer, ingredients to be blended shown in the following Tables 1 to 3 were blended and kneaded to prepare insulating materials.

Onto a release PET sheet (50 μm in thickness), each of the insulating materials was applied so as to have an aimed thickness and dried for 30 minutes in an oven at 90° C. to make the solvent volatilize. A sheet-like insulating material was thus prepared.

In each of Examples 1 to 9, 12 to 16, and Comparative Examples 1 to 6, the obtained sheet-like insulating material was bonded onto a metal plate with the use of a heat laminator to prepare a laminated body with a three-layer constitution which has an insulating resin layer. Afterward, curing was performed for 1 hour at 180° C. to obtain a cured laminated structural body. Afterward, metal layer portions of this laminated structural body were etched to prepare a laminated body having a prescribed metal layer portion-area ratio. In each of Examples 10 to 11, first, punching press were performed to prepare a metal plate having front and back sides which have a prescribed area size and are equal to each other in the occupation area. Afterward, the metal plate and a sheet-like insulating material were bonded together with the use of a heat laminator to prepare a laminated body before curing with a three-layer structure in which an insulating layer side of metal layer portion and a metal layer side opposite to the insulating layer side each have prescribed area ratio, and have the same area ratio to each other. Afterward, curing was performed for 1 hour at 180° C. to prepare a laminated body having an insulating layer side and a metal layer side opposite to the insulating layer side which have a prescribed area size and are equal to each other in the metal layer portion-area ratio.

(Evaluation)
(1) Measurement of Thicknesses of Respective Layers

With regard to the obtained laminated body, a section of the laminated body was observed by the use of a microscope ("VHX-5000" available from KEYENCE CORPORATION) and the laminated body was measured for the thicknesses of the respective layers.

(2) Measurement of Surface Area of Surface Opposite to Insulating Resin Layer of Metal Material The obtained laminated body was observed by the use of the Image Dimension Measuring System ("IM-6125" available from KEYENCE CORPORATION) to be measured for the surface area.

(3) Measurement of Glass Transition Temperature

A sheet-like insulating material was cured for 1 hour at 180° C. to obtain a cured product (insulating resin layer).

The obtained cured product was measured for the glass transition temperature at a temperature increasing rate of 5° C./minute with the use of a dynamic viscoelasticity measuring apparatus ("DMS6100" available from Hitachi High-Tech Science Corporation).

(4) Measurement of Elastic Modulus

A sheet-like insulating material was cured for 1 hour at 180° C. to obtain a cured product (insulating resin layer).

With the use of a dynamic viscoelasticity measuring apparatus ("DMS6100" available from Hitachi High-Tech Science Corporation), a cured product (insulating resin layer) was measured for the elastic modulus under the condition of 25° C.

(5) Measurement of Linear Expansion Coefficient

A sheet-like insulating material was cured for 1 hour at 180° C. to obtain a cured product (insulating resin layer).

With the use of a thermomechanical analysis apparatus ("TMA-60" available from SHIMADZU CORPORATION), the cured product (insulating resin layer) and the first and second metal materials were measured for the linear expansion coefficient under the condition ranging from 25° C. to the glass transition temperature.

(6) Measurement of Arithmetic Average Roughness Ra

The obtained laminated body was measured for the arithmetic average roughness Ra of a surface opposite to the insulating resin layer side of the first metal material, the arithmetic average roughness Ra of a surface opposite to the insulating resin layer side of the second metal material, the arithmetic average roughness Ra of a surface at the insulating resin layer side of the first metal material, and the arithmetic average roughness Ra of a surface at the insulating resin layer side of the second metal material.

With regard to a specific measurement method, the arithmetic average roughness Ra was measured at a moving speed of 0.6 mm with the use of a surface texture measuring instrument ("SURFCOM FLEX" available from TOKYO SEIMITSU CO., LTD.).

(7) Measurement of Thermal Conductivity

A sheet-like insulating material was cured for 1 hour at 180° C. to obtain a cured product (insulating resin layer).

With the use of a thermal conductivity meter ("Quick Thermal Conductivity Meter QTM-500" available from Kyoto Electronics Manufacturing Co., Ltd.), a cured product (insulating resin layer) was measured for the thermal conductivity.

(8) Thermal Resistance

A heat generating body which has the same size as that of the laminated body, is controlled at 60° C., and has a smooth surface was prepared. The obtained laminated body was pushed to the heat generating body at a pressure of 1 kgf and a face at the opposite side of the heat generating body was measured for the temperature by the use of a thermocouple to evaluate the thermal resistance. The thermal resistance was judged according to the following criteria.

[Criteria for Judgment in Thermal Resistance]

∘∘: The temperature difference between the heat generating body and a surface opposite to the heat generating body side of the laminated body is 5° C. or less.

∘: The temperature difference between the heat generating body and a surface opposite to the heat generating body side of the laminated body is more than 5° C. and 10° C. or less.

Δ: The temperature difference between the heat generating body and a surface opposite to the heat generating body side of the laminated body is more than 10° C. and 30° C. or less.

x: The temperature difference between the heat generating body and a surface opposite to the heat generating body side of the laminated body is more than 30° C.

(9) Peeling Preventive Properties after Cooling/Heating Cycle

With the use of the "Model TSB-51" available from ESPEC CORP., 10 laminated bodies obtained were subjected to a cooling/heating cycle test of −40° C. for 5 minutes to +125° C. for 5 minutes, the test was repeated 1000 times, and the occurrence of floating or peeling was confirmed to evaluate the peeling preventive properties after a cooling/heating cycle. The peeling preventive properties after a cooling/heating cycle were judged according to the following criteria.

[Criteria for Judgment in Peeling Preventive Properties after Cooling/Heating Cycle]

∘∘: There are no parts with floating or peeling.

∘: There are 1 to 2 parts with floating or peeling.

Δ: There are 3 to 5 parts with floating or peeling.

x: There are 6 to 10 parts with floating or peeling.

The composition of each insulating material is shown in the following Tables 1 to 3. The constitution of each laminated body and the evaluation results of each laminated body are shown in the following Tables 4 to 6.

TABLE 1

| | | | Example 1 | Example 2 | Example 3 | Example 4 | Example 5 | Example 6 | Example 7 | Example 8 |
|---|---|---|---|---|---|---|---|---|---|---|
| Ingredients to be blended (parts by weight) | Curable compound (A1) | Bisphenol A type liquid epoxy resin | 5.5 | 5.5 | 5.5 | 5.5 | 5.5 | | | |
| | | Bisphenol F type liquid epoxy resin | | | | | | 11 | | |
| | | Naphthalene type liquid epoxy resin | | | | | | | 3 | 2 |
| | Curable compound (A2) | Epoxy group-containing styrene resin | | | | | | | 4 | 2 |
| | | Bisphenol A type phenoxy resin | 9 | 9 | 9 | 9 | 9 | 18 | | |
| | Curing agent (B) | Acid anhydride with alicyclic skeleton | 4 | 4 | 4 | 4 | 4 | 8 | | |
| | | Phenol resin with biphenyl skeleton | | | | | | | 2 | 1 |
| | | Isocyanurate-modified solid-dispersed imidazole | 1 | 1 | 1 | 1 | 1 | 2 | 0.5 | 0.2 |
| | Inorganic filler (C) | 5-μm Alumina | 80 | 80 | 80 | 80 | 80 | 60 | 90 | 95 |
| | | Boron nitride | | | | | | | | |
| | | Aluminum nitride | | | | | | | | |

TABLE 1-continued

|  |  | Example 1 | Example 2 | Example 3 | Example 4 | Example 5 | Example 6 | Example 7 | Example 8 |
|---|---|---|---|---|---|---|---|---|---|
| Additional ingredient | Epoxysilane coupling agent | 0.5 | 0.5 | 0.5 | 0.5 | 0.5 | 1 | 0.5 | 0.25 |
| Solvent | Methyl ethyl ketone | 30 | 30 | 30 | 30 | 30 | 30 | 30 | 30 |

TABLE 2

|  |  |  | Example 9 | Example 10 | Example 11 | Example 12 | Example 13 | Example 14 | Example 15 | Example 16 |
|---|---|---|---|---|---|---|---|---|---|---|
| Ingredients to be blended (parts by weight) | Curable compound (A1) | Bisphenol A type liquid epoxy resin |  | 5.5 | 5.5 | 5.5 | 5.5 | 5.5 | 2 |  |
|  |  | Bisphenol F type liquid epoxy resin | 16.5 |  |  |  |  |  |  |  |
|  |  | Naphthalene type liquid epoxy resin |  |  |  |  |  |  |  | 5.5 |
|  | Curable compound (A2) | Epoxy group-containing styrene resin |  |  |  |  |  |  |  | 9 |
|  |  | Bisphenol A type phenoxy resin | 28 | 9 | 9 | 9 | 9 | 9 | 3.5 |  |
|  | Curing agent (B) | Acid anhydride with alicyclic skeleton | 12 | 4 | 4 | 4 | 4 | 4 | 1 |  |
|  |  | Phenol resin with biphenyl skeleton |  |  |  |  |  |  |  | 4 |
|  |  | Isocyanurate-modified solid-dispersed imidazole | 2 | 1 | 1 | 1 | 1 | 1 | 0.25 | 1 |
|  | Inorganic filler (C) | 5-μm Alumina | 40 | 80 | 80 | 80 | 80 | 80 | 93 | 80 |
|  |  | Boron nitride |  |  |  |  |  |  |  |  |
|  |  | Aluminum nitride |  |  |  |  |  |  |  |  |
|  | Additional ingredient | Epoxysilane coupling agent | 1.5 | 0.5 | 0.5 | 0.5 | 0.5 | 0.5 | 0.25 | 0.5 |
|  | Solvent | Methyl ethyl ketone | 30 | 30 | 30 | 30 | 30 | 30 | 30 | 30 |

TABLE 3

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| Ingredients to be blended (parts by weight) | Curable compound (A1) | Bisphenol A type liquid epoxy resin | 5.5 | 5.5 | 5.5 | 5.5 | 5.5 | 5.5 |
|  |  | Bisphenol F type liquid epoxy resin |  |  |  |  |  |  |
|  |  | Naphthalene type liquid epoxy resin |  |  |  |  |  |  |
|  | Curable compound (A2) | Epoxy group-containing styrene resin | 9 | 9 | 9 | 9 | 9 | 9 |
|  |  | Bisphenol A type phenoxy resin |  |  |  |  |  |  |
|  | Curing agent (B) | Acid anhydride with alicyclic skeleton | 4 | 4 | 4 | 4 | 4 | 4 |
|  |  | Phenol resin with biphenyl skeleton |  |  |  |  |  |  |
|  |  | Isocyanurate-modified solid-dispersed imidazole | 1 | 1 | 1 | 1 | 1 | 1 |
|  | Inorganic filler (C) | 5-μm Alumina | 80 | 80 | 80 | 80 | 80 | 80 |
|  |  | Boron nitride |  |  |  |  |  |  |
|  |  | Aluminum nitride |  |  |  |  |  |  |
|  | Additional ingredient | Epoxysilane coupling agent | 0.5 | 0.5 | 0.5 | 0.5 | 0.5 | 0.5 |
|  | Solvent | Methyl ethyl ketone | 30 | 30 | 30 | 30 | 30 | 30 |

TABLE 4

|  |  | Example 1 | Example 2 | Example 3 | Example 4 |
|---|---|---|---|---|---|
| Thickness of insulating resin layer (0) | μm | 100 | 100 | 100 | 100 |
| Thickness of first metal material (1) | μm | 200 | 200 | 250 | 500 |
| Thickness of second metal material (2) | μm | 200 | 800 | 750 | 600 |
| Total of Thickness (1) and Thickness (2) | μm | 400 | 1000 | 1000 | 1000 |
| Thickness (1)/Thickness (2) |  | 1.00 | 0.25 | 0.33 | 0.67 |
| Surface area of surface opposite to insulating resin layer side of first metal material (1) | cm2 | 75 | 75 | 75 | 75 |

TABLE 4-continued

| | | | | | |
|---|---|---|---|---|---|
| Surface area of surface opposite to insulating resin layer side of second metal material (2) | cm2 | 100 | 100 | 100 | 100 |
| Surface area (1)/Surface area (2) | | 0.75 | 0.75 | 0.75 | 0.75 |
| Surface area of surface at insulating resin layer side of first metal material (1*) | cm2 | 77 | 77 | 78 | 80 |
| Surface area of surface at insulating resin layer side of second metal material (2*) | cm2 | 100 | 100 | 100 | 100 |
| Surface area (1)/Surface area (1*) | | 0.97 | 0.97 | 0.96 | 0.94 |
| Surface area (2)/Surface area (2*) | | 1.00 | 1.00 | 1.00 | 1.00 |
| Whether side face of first metal material is inwardly inclined or not inclined | | Inclined | Inclined | Inclined | Inclined |
| Whether side face of second metal material is inwardly inclined or not inclined | | Not inclined | Not inclined | Not inclined | Not inclined |
| Glass transition temperature of insulating resin layer | ° C. | 110 | 110 | 110 | 110 |
| Elastic modulus of insulating resin layer | GPa | 11 | 11 | 11 | 11 |
| Linear expansion coefficient of insulating resin layer (0) | ppm/° C. | 25 | 25 | 25 | 25 |
| Linear expansion coefficient of first metal material (1) | ppm/° C. | 16.8 | 16.8 | 16.8 | 16.8 |
| Linear expansion coefficient of second metal material (2) | ppm/° C. | 16.8 | 16.8 | 16.8 | 16.8 |
| Linear expansion coefficient (0)/Linear expansion coefficient (1) | | 1.49 | 1.49 | 1.49 | 1.49 |
| Linear expansion coefficient (0)/Linear expansion coefficient (2) | | 1.49 | 1.49 | 1.49 | 1.49 |
| Ra of surface at opposite side of insulating resin layer side of first metal material (1) | μm | 0.2 | 0.2 | 0.2 | 0.2 |
| Ra of surface at opposite side of insulating resin layer side of second metal material (2) | μm | 0.2 | 0.2 | 0.2 | 0.2 |
| Ra of surface at insulating resin layer side of first metal material (1) | μm | 0.4 | 0.4 | 0.4 | 0.4 |
| Ra of surface at insulating resin layer side of first metal material (2) | μm | 0.4 | 0.4 | 0.4 | 0.4 |
| Thermal conductivity | W/m·K | 2.8 | 2.8 | 2.8 | 2.8 |
| Thermal resistance | | ⊙ | ⊙ | ⊙ | ⊙ |
| Peeling preventive properties after cooling/heating cycle | | ⊙ | ○ | ○ | ⊙ |

| | | Example 5 | Example 6 | Example 7 | Example 8 |
|---|---|---|---|---|---|
| Thickness of insulating resin layer (0) | μm | 100 | 100 | 100 | 100 |
| Thickness of first metal material (1) | μm | 450 | 200 | 200 | 200 |
| Thickness of second metal material (2) | μm | 550 | 200 | 200 | 200 |
| Total of Thickness (1) and Thickness (2) | μm | 1000 | 400 | 400 | 400 |
| Thickness (1)/Thickness (2) | | 0.82 | 1.00 | 1.00 | 1.00 |
| Surface area of surface opposite to insulating resin layer side of first metal material (1) | cm2 | 75 | 75 | 75 | 75 |
| Surface area of surface opposite to insulating resin layer side of second metal material (2) | cm2 | 100 | 100 | 100 | 100 |
| Surface area (1)/Surface area (2) | | 0.75 | 0.75 | 0.75 | 0.75 |
| Surface area of surface at insulating resin layer side of first metal material (1*) | cm2 | 83 | 77 | 77 | 77 |
| Surface area of surface at insulating resin layer side of second metal material (2*) | cm2 | 100 | 100 | 100 | 100 |
| Surface area (1)/Surface area (1*) | | 0.90 | 0.97 | 0.97 | 0.97 |
| Surface area (2)/Surface area (2*) | | 1.00 | 1.00 | 1.00 | 1.00 |
| Whether side face of first metal material is inwardly inclined or not inclined | | Inclined | Inclined | Inclined | Inclined |
| Whether side face of second metal material is inwardly inclined or not inclined | | Not inclined | Not inclined | Not inclined | Not inclined |
| Glass transition temperature of insulating resin layer | ° C. | 110 | 100 | 180 | 180 |
| Elastic modulus of insulating resin layer | GPa | 11 | 7 | 21 | 34 |
| Linear expansion coefficient of insulating resin layer (0) | ppm/° C. | 25 | 35 | 4 | 6 |
| Linear expansion coefficient of first metal material (1) | ppm/° C. | 16.8 | 16.8 | 16.8 | 16.8 |
| Linear expansion coefficient of second metal material (2) | ppm/° C. | 16.8 | 16.8 | 16.8 | 16.8 |
| Linear expansion coefficient (0)/Linear expansion coefficient (1) | | 1.49 | 2.08 | 0.48 | 0.36 |
| Linear expansion coefficient (0)/Linear expansion coefficient (2) | | 1.49 | 2.08 | 0.48 | 0.36 |
| Ra of surface at opposite side of insulating resin layer side of first metal material (1) | μm | 0.2 | 0.2 | 0.2 | 0.2 |
| Ra of surface at opposite side of insulating resin layer side of second metal material (2) | μm | 0.2 | 0.2 | 0.2 | 0.2 |
| Ra of surface at insulating resin layer side of first metal material (1) | μm | 0.4 | 0.4 | 0.4 | 0.4 |
| Ra of surface at insulating resin layer side of first metal material (2) | μm | 0.4 | 0.4 | 0.4 | 0.4 |
| Thermal conductivity | W/m·K | 2.8 | 1.2 | 5.2 | 5.9 |
| Thermal resistance | | ⊙ | ⊙ | ⊙ | ⊙ |
| Peeling preventive properties after cooling/heating cycle | | ⊙ | ○ | ○ | ○ |

TABLE 5

|  |  | Example 9 | Example 10 | Example 11 | Example 12 |
|---|---|---|---|---|---|
| Thickness of insulating resin layer (0) | μm | 100 | 100 | 100 | 100 |
| Thickness of first metal material (1) | μm | 200 | 200 | 200 | 200 |
| Thickness of second metal material (2) | μm | 200 | 200 | 200 | 200 |
| Total of Thickness (1) and Thickness (2) | μm | 400 | 400 | 400 | 400 |
| Thickness (1)/Thickness (2) |  | 1.00 | 1.00 | 1.00 | 1.00 |
| Surface area of surface opposite to insulating resin layer side of first metal material (1) | cm2 | 75 | 75 | 100 | 75 |
| Surface area of surface opposite to insulating resin layer side of second metal material (2) | cm2 | 100 | 100 | 75 | 100 |
| Surface area (1)/Surface area (2) |  | 0.75 | 0.75 | 1.23 | 0.75 |
| Surface area of surface at insulating resin layer side of first metal material (1*) | cm2 | 77 | 75 | 100 | 77 |
| Surface area of surface at insulating resin layer side of second metal material (2*) | cm2 | 100 | 100 | 75 | 100 |
| Surface area (1)/Surface area (1*) |  | 0.97 | 1.00 | 1.00 | 0.97 |
| Surface area (2)/Surface area (2*) |  | 1.00 | 1.00 | 1.00 | 1.00 |
| Whether side face of first metal material is inwardly inclined or not inclined |  | Inclined | Not inclined | Not inclined | Inclined |
| Whether side face of second metal material is inwardly inclined or not inclined |  | Not inclined | Not inclined | Not inclined | Not inclined |
| Glass transition temperature of insulating resin layer | ° C. | 100 | 110 | 110 | 110 |
| Elastic modulus of insulating resin layer | GPa | 0.9 | 11 | 11 | 11 |
| Linear expansion coefficient of insulating resin layer (0) | ppm/° C. | 82 | 25 | 25 | 25 |
| Linear expansion coefficient of first metal material (1) | ppm/° C. | 16.8 | 16.8 | 16.8 | 16.8 |
| Linear expansion coefficient of second metal material (2) | ppm/° C. | 16.8 | 16.8 | 16.8 | 16.8 |
| Linear expansion coefficient (0)/Linear expansion coefficient (1) |  | 4.88 | 1.49 | 1.49 | 1.49 |
| Linear expansion coefficient (0)/Linear expansion coefficient (2) |  | 4.88 | 1.49 | 1.49 | 1.49 |
| Ra of surface at opposite side of insulating resin layer side of first metal material (1) | μm | 0.2 | 0.2 | 0.2 | 3 |
| Ra of surface at opposite side of insulating resin layer side of second metal material (2) | μm | 0.2 | 0.2 | 0.2 | 3 |
| Ra of surface at insulating resin layer side of first metal material (1) | μm | 0.4 | 0.4 | 0.4 | 0.4 |
| Ra of surface at insulating resin layer side of first metal material (2) | μm | 0.4 | 0.4 | 0.4 | 0.4 |
| Thermal conductivity | W/m · K | 0.5 | 2.8 | 2.8 | 2.8 |
| Thermal resistance |  | ◯ | ◯◯ | ◯◯ | ◯ |
| Peeling preventive properties after cooling/heating cycle |  | Δ | ◯ | ◯ | ◯◯ |

|  |  | Example 13 | Example 14 | Example 15 | Example 16 |
|---|---|---|---|---|---|
| Thickness of insulating resin layer (0) | μm | 100 | 100 | 100 | 100 |
| Thickness of first metal material (1) | μm | 200 | 200 | 200 | 200 |
| Thickness of second metal material (2) | μm | 200 | 200 | 200 | 200 |
| Total of Thickness (1) and Thickness (2) | μm | 400 | 400 | 400 | 400 |
| Thickness (1)/Thickness (2) |  | 1.00 | 1.00 | 1.00 | 1.00 |
| Surface area of surface opposite to insulating resin layer side of first metal material (1) | cm2 | 75 | 60 | 75 | 75 |
| Surface area of surface opposite to insulating resin layer side of second metal material (2) | cm2 | 100 | 100 | 100 | 100 |
| Surface area (1)/Surface area (2) |  | 0.75 | 0.6 | 0.75 | 0.75 |
| Surface area of surface at insulating resin layer side of first metal material (1*) | cm2 | 77 | 77 | 77 | 77 |
| Surface area of surface at insulating resin layer side of second metal material (2*) | cm2 | 100 | 100 | 100 | 100 |
| Surface area (1)/Surface area (1*) |  | 0.97 | 0.78 | 0.97 | 0.97 |
| Surface area (2)/Surface area (2*) |  | 1.00 | 1.00 | 1.00 | 1.00 |
| Whether side face of first metal material is inwardly inclined or not inclined |  | Inclined | Inclined | Inclined | Inclined |
| Whether side face of second metal material is inwardly inclined or not inclined |  | Not inclined | Not inclined | Not inclined | Not inclined |
| Glass transition temperature of insulating resin layer | ° C. | 110 | 110 | 130 | 190 |
| Elastic modulus of insulating resin layer | GPa | 11 | 11 | 46 | 16 |
| Linear expansion coefficient of insulating resin layer (0) | ppm/° C. | 25 | 25 | 10 | 32 |
| Linear expansion coefficient of first metal material (1) | ppm/° C. | 16.8 | 16.8 | 16.8 | 16.8 |
| Linear expansion coefficient of second metal material (2) | ppm/° C. | 16.8 | 16.8 | 14.8 | 16.8 |
| Linear expansion coefficient (0)/Linear expansion coefficient (1) |  | 1.49 | 1.49 | 0.60 | 1.31 |
| Linear expansion coefficient (0)/Linear expansion coefficient (2) |  | 1.49 | 1.49 | 0.60 | 1.31 |
| Ra of surface at opposite side of insulating resin layer side of first metal material (1) | μm | 0.2 | 0.2 | 0.2 | 0.2 |
| Ra of surface at opposite side of insulating resin layer side of second metal material (2) | μm | 0.2 | 0.2 | 0.2 | 0.2 |
| Ra of surface at insulating resin layer side of first metal material (1) | μm | 0.08 | 0.1 | 0.1 | 0.1 |
| Ra of surface at insulating resin layer side of first metal material (2) | μm | 0.08 | 0.1 | 0.1 | 0.1 |
| Thermal conductivity | W/m · K | 2.8 | 2.8 | 5.3 | 3.5 |

TABLE 5-continued

| | | | | |
|---|---|---|---|---|
| Thermal resistance | ⊙ | ○ | ⊙ | ⊙ |
| Peeling preventive properties after cooling/heating cycle | ○ | ⊙ | ⊙ | ⊙ |

TABLE 6

| | | Comparative Example 1 | Comparative Example 2 | Comparative Example 3 | Comparative Example 4 | Comparative Example 5 | Comparative Example 6 |
|---|---|---|---|---|---|---|---|
| Thickness of insulating resin layer (0) | μm | 210 | 100 | 100 | 100 | 100 | 100 |
| Thickness of first metal material (1) | μm | 200 | 90 | 200 | 30 | 200 | 200 |
| Thickness of second metal material (2) | μm | 200 | 90 | 30 | 200 | 200 | 200 |
| Total of Thickness (1) and Thickness (2) | μm | 400 | 180 | 230 | 230 | 400 | 400 |
| Thickness (1)/Thickness (2) | | 1.00 | 1.00 | 6.67 | 0.15 | 1.00 | 1.00 |
| Surface area of surface opposite to insulating resin layer side of first metal material (1) | cm2 | 75 | 75 | 75 | 75 | 45 | 100 |
| Surface area of surface opposite to insulating resin layer side of second metal material (2) | cm2 | 100 | 100 | 100 | 100 | 100 | 45 |
| Surface area (1)/Surface area (2) | | 0.75 | 0.75 | 0.75 | 0.75 | 0.45 | 2.22 |
| Surface area of surface at insulating resin layer side of first metal material (1*) | cm2 | 77 | 76 | 77 | 75 | 46 | 100 |
| Surface area of surface at insulating resin layer side of second metal material (2*) | cm2 | 100 | 100 | 100 | 100 | 100 | 46 |
| Surface area (1)/Surface area (1*) | | 0.97 | 0.99 | 0.97 | 1.00 | 0.98 | 1.00 |
| Surface area (2)/Surface area (2*) | | 1.00 | 1.00 | 1.00 | 1.00 | 1.00 | 0.98 |
| Whether side face of first metal material is inwardly inclined or not inclined | | Inclined | Inclined | Inclined | Inclined | Inclined | Not inclined |
| Whether side face of second metal material is inwardly inclined or not inclined | | Not inclined | Not inclined | Not inclined | Not inclined | Not inclined | Inclined |
| Glass transition temperature of insulating resin layer | ° C. | 110 | 110 | 110 | 110 | 110 | 110 |
| Elastic modulus of insulating resin layer | GPa | 11 | 11 | 11 | 11 | 11 | 11 |
| Linear expansion coefficient of insulating resin layer (0) | ppm/° C. | 25 | 25 | 25 | 25 | 25 | 25 |
| Linear expansion coefficient of first metal material (1) | ppm/° C. | 16.8 | 16.8 | 16.8 | 16.8 | 16.8 | 16.8 |
| Linear expansion coefficient of second metal material (2) | ppm/° C. | 16.8 | 16.8 | 16.8 | 16.8 | 16.8 | 16.8 |
| Linear expansion coefficient (0)/Linear expansion coefficient (1) | | 1.49 | 1.49 | 1.49 | 1.49 | 1.49 | 1.49 |
| Linear expansion coefficient (0)/Linear expansion coefficient (2) | | 1.49 | 1.49 | 1.49 | 1.49 | 1.49 | 1.49 |
| Ra of surface at opposite side of insulating resin layer side of first metal material (1) | μm | 0.2 | 0.2 | 0.2 | 0.2 | 0.2 | 0.2 |
| Ra of surface at opposite side of insulating resin layer side of second metal material (2) | μm | 0.2 | 0.2 | 0.2 | 0.2 | 0.2 | 0.2 |
| Ra of surface at insulating resin layer side of first metal material (1) | μm | 0.4 | 0.4 | 0.4 | 0.4 | 0.4 | 0.4 |
| Ra of surface at insulating resin layer side of first metal material (2) | μm | 0.4 | 0.4 | 0.4 | 0.4 | 0.4 | 0.4 |
| Thermal conductivity | W/m · K | 2.8 | 2.8 | 2.8 | 2.8 | 2.8 | 2.8 |
| Thermal resistance | | X | X | Δ | Δ | Δ | Δ |
| Peeling preventive properties after cooling/heating cycle | | ○ | Δ | X | X | X | X |

EXPLANATION OF SYMBOLS 1, 1A: Laminated body
11: Insulating resin layer
12: First metal material
13, 13A: Second metal material

The invention claimed is:

1. A laminated body, comprising:
an insulating resin layer;
a first metal material being a metal foil or a metal plate; and
a second metal material being a metal foil or a metal plate,
the first metal material being layered on a first surface of the insulating resin layer and the second metal material being layered on a second surface opposite to the first surface of the insulating resin layer,
the first metal material constitutes a circuit, the second metal material does not constitute a circuit, the second metal material being formed over the entire second surface of the insulating resin layer,
the thickness of the insulating resin layer being 200 μm or less,
the total thickness of the first metal material and the second metal material being 200 μm or more,
the ratio of the thickness of the first metal material to the thickness of the second metal material being 0.2 or more and 5 or less, and
the ratio of the surface area of a surface opposite to the insulating resin layer side of the first metal material to the surface area of a surface opposite to the insulating resin layer side of the second metal material being 0.5 or more and 2 or less.

2. The laminated body according to claim 1,
wherein the ratio of the linear expansion coefficient of the insulating resin layer to the linear expansion coefficient of the first metal material is 0.5 or more and 2 or less and the ratio of the linear expansion coefficient of the insulating resin layer to the linear expansion coefficient of the second metal material is 0.5 or more and 2 or less.

3. The laminated body according to claim 1, wherein the elastic modulus at 25° C. of the insulating resin layer is 1 GPa or more and 50 GPa or less.

4. The laminated body according to claim 1, wherein a side face of the first metal material is inclined to the inner side of the first metal material progressively toward a surface side opposite to the insulating resin layer side.

5. The laminated body according to claim 1, wherein a side face of the second metal material is inclined to the inner side of the second metal material progressively toward a surface side opposite to the insulating resin layer side.

6. The laminated body according to claim 5, wherein the ratio of the surface area of a surface opposite to the insulating resin layer side of the second metal material to the surface area of a surface at the insulating resin layer side of the second metal material is 0.8 or more and 1 or less.

7. The laminated body according to claim 1, wherein the insulating resin layer has a portion on which no first metal material is layered, the arithmetic average roughness Ra of a surface opposite to the insulating resin layer side of the first metal material is 2 μm or less, and the arithmetic average roughness Ra of a surface at the insulating resin layer side of the first metal material is 0.1 μm or more.

8. The laminated body according to claim 1, wherein the ratio of the surface area of a surface opposite to the insulating resin layer side of the first metal material to the surface area of a surface at the insulating resin layer side of the first metal material is 0.8 or more and less than 1.0.

9. The laminated body according to claim 1, wherein the insulating resin layer has a portion on which no second metal material is layered, the arithmetic average roughness Ra of a surface opposite to the insulating resin layer side of the second metal material is 2 μm or less, and the arithmetic average roughness Ra of a surface at the insulating resin layer side of the second metal material is 0.1 μm or more.

10. The laminated body according to claim 1, wherein the glass transition temperature of the insulating resin layer is 150° C. or more.

11. The laminated body according to claim 1, wherein the insulating resin layer is not constituted of a prepreg.

12. The laminated body according to claim 1, wherein a surface at the opposite side of the insulating resin layer side of the first metal material is exposed or a protective film is layered on the surface at the opposite side of the insulating resin layer side of the first metal material, and
a surface at the opposite side of the insulating resin layer side of the second metal material is exposed or a protective film is layered on the surface at the opposite side of the insulating resin layer side of the second metal material.

13. The laminated body according to claim 1, wherein a surface at the opposite side of the insulating resin layer side of the first metal material is exposed.

14. The laminated body according to claim 1, wherein the insulating resin layer contains an inorganic filler.

* * * * *